US007254370B2

(12) United States Patent
Mills

(10) Patent No.: US 7,254,370 B2
(45) Date of Patent: Aug. 7, 2007

(54) METHOD TO MAINTAIN STABILITY IN A BI-DIRECTIONAL AMPLIFIER

(75) Inventor: Donald C. Mills, Bedford, NH (US)

(73) Assignee: Cellular Specialties, Inc., Manchester, NH (US)

( * ) Notice: Subject to any disclaimer, the term of this patent is extended or adjusted under 35 U.S.C. 154(b) by 283 days.

(21) Appl. No.: 10/894,445

(22) Filed: Jul. 19, 2004

(65) Prior Publication Data

US 2005/0018863 A1   Jan. 27, 2005

Related U.S. Application Data

(60) Provisional application No. 60/488,840, filed on Jul. 21, 2003.

(51) Int. Cl.
*H04B 17/00* (2006.01)
*H04B 1/04* (2006.01)

(52) U.S. Cl. .................. 455/73; 455/67.11; 455/127.2; 455/232.1; 330/129

(58) Field of Classification Search ............. 455/127.2, 455/232.1, 234.1–251.1, 67.11–67.14; 330/129–137; 375/345
See application file for complete search history.

(56) References Cited

U.S. PATENT DOCUMENTS 6,009,324 A    12/1999  Pravitz et al. .............. 455/423
6,493,537 B1   12/2002  Ogaewa ......................... 455/9
6,617,965 B1*  9/2003   Cantone et al. ............. 375/258
6,748,194 B2   6/2004   Oh et al. .................... 455/11.1
7,065,165 B2*  6/2006   Heinonen et al. ........... 375/345
2002/0045431 A1  4/2002  Bongfeldt ................ 455/234.1
2002/0158689 A1* 10/2002 Harris et al. ................. 330/129
2004/0095992 A1  5/2004  Balaberda ................... 375/213
2004/0104771 A1* 6/2004  Dauphinee et al. ......... 330/129

\* cited by examiner

*Primary Examiner*—Simon Nguyen
(74) *Attorney, Agent, or Firm*—Bourque and Associates

(57) ABSTRACT

A method for controlling an adjustable gain in an amplifier having an output power level and an adjustable gain is disclosed. The method includes an enhancement to a conventional Automatic Gain Control (AGC) function that distinguishes between a signal caused by oscillation and a signal that actually appears in the amplifier's passband. The method also controls unwanted and out of control amplifier oscillation using an iterative correlation process. The method prevents gain "hunting" if the output signal level is near the "set point" of the maximum permitted output level by implementing some degree of Hysteresis. The correlation process is performed by tracking a specified number of alternating gain increase/decrease cycles. If in any cycle the gain is not changed, or is changed in the same direction as in the previous cycle, the correlator is reset and the process begins again. The value and/or length of the correlator is set to minimize false detection due to random signal inputs, while maintaining acceptable sensitivity to oscillation.

6 Claims, 2 Drawing Sheets

METHOD TO MAINTAIN STABILITY IN A BI-DIRECTIONAL AMPLIFIER

CROSS-REFERENCE TO RELATED APPLICATION

This application claims priority from U.S. Provisional Patent Application No. 60/488,840, entitled "A Method to Maintain Stability in a Bi-directional Amplifier," which was filed on Jul. 21, 2003.

TECHNICAL FIELD OF THE INVENTION

This invention relates to a method for detecting and controlling oscillation caused by inadequate isolation between antennas used with a bi-directional amplifier and more particularly, to a method for enhancing an Automatic Gain Control (AGC) function that distinguishes between a strong signal caused by oscillation and a strong signal that appears in a passband of the amplifier.

DESCRIPTION OF THE RELATED ART

Typically, an amplifier will oscillate when a sufficient component of its output is fed back to its input in phase. Generally, a situation in which the gain of the amplifier is greater than the loss between the antenna connections will bring about this condition. This situation is considered in the design of an oscillator. In the case of an amplifier used to enhance wireless signals, the amplifier is placed between a first antenna for receiving and transmitting the wireless signal from and to the wireless base station, and a second antenna for re-radiating the signals from the wireless base station to a wireless subscriber's device. A finite amount of signal will be "fed back" to the first antenna to complete this feedback loop, and may cause the amplifier to oscillate, generating undesired signals in one or both passbands.

The oscillation condition may not be apparent to the user or installer; however, it may result in severe degradation of the communication system. In some cases, it can cause an RF channel to be taken out of service completely due to interference. Decreasing the gain of the amplifier below the level required for oscillation will cause the oscillation to cease.

Some amplifiers known in the prior art temporarily increase their gain significantly above their nominal gain level and test for an overload condition, indicating oscillation. This procedure may be repeated at intervals, but will change the operating parameters of the wireless distribution system.

In another implementation, a signal is generated in the amplifier and detected at the amplifier's input. However, this may cause interference and require additional circuitry to generate and detect this signal. In another common implementation, an output is fed back to an input at a specific amplitude and with a specific time delay, to cancel feedback signal(s) external to the amplifier.

Attempts have been made in the prior art at power sensing at the input with a separate amplifier/detector, and imposing a "signature" on the signals, causing some degree of distortion. There are devices in the prior art that generate an in-band signal, which radiates unwanted RF energy, and require a matched detector to detect the level of the signal fed back to the amplifier input. Other devices in the prior art require a narrowband detector, and impose a signature on the repeated signal. Other devices rely on the timing of a specific air interface technology (GSM) to detect instability; however, it also completely switches off the RF path in the process. Another device in the prior art requires disconnecting the amplifier, which is intrusive. It requires a detector at the amplifier input, and it completely shuts the amplifier off if oscillation is detected.

One method employed in the prior art imposes a specific characteristic on the output signal by amplitude modulating the gain of the amplifier with a unique "code" and employing a dedicated detector to determine the amplitude of the modulated signal at the input to the amplifier. Although it can detect levels of isolation above that required for oscillation in the presence of very strong signals, it requires costly dedicated circuitry and adds some degree of distortion to the outputs of the amplifier.

Low-end products have limited their functionality to detecting an overload condition (e.g., power output above a preset threshold) and shutting the amplifier off for some period of time. This results in the amplifier being non-functional, thus failing to provide service in its coverage area. Further, it results in high-level oscillation occurring each time the amplifier attempts to recover, potentially degrading the operation of subscriber or infrastructure equipment.

The present invention is directed to overcoming one or more of the problems or disadvantages set forth above and providing a method for satisfying needs that the prior art does not meet.

It is important to note that the present invention is not intended to be limited to a system or method which must satisfy one or more of any stated objects or features of the invention. It is also important to note that the present invention is not limited to the preferred, exemplary, or primary embodiment(s) described herein. Modifications and substitutions by one of ordinary skill in the art are considered to be within the scope of the present invention, which is not to be limited except by the following claims.

SUMMARY OF THE INVENTION

The present invention features a low cost method of maintaining stability in a bi-directional amplifier. In one aspect of the present invention, this is performed entirely by software and adds no cost to the product. This feature is particularly relevant to the low end or low cost market to address concerns from wireless carriers that amplifiers installed with inadequate antenna isolation can oscillate in their licensed frequency range and potentially degrade their network.

In another aspect of the invention, there is disclosed a method for detecting and controlling oscillation caused by inadequate isolation between antennas used with a bi-directional amplifier. The method includes the acts of enhancing an Automatic Gain Control (AGC) function for distinguishing between a strong signal caused by oscillation and a strong signal that actually appears in a passband of the amplifier. The response of the AGC function is characterized for each type of signal, and a correlation process is used to identify oscillation and initiate a responsive amplifier gain change to eliminate this undesirable condition. The method imposes no unique characteristics on, and causes no degradation to, the output signal.

The present invention thus features a method for distinguishing between a strong signal caused by oscillation and a strong signal that appears in a passband of an amplifier. Specifically, the present invention features a method including the acts of monitoring output power from the amplifier and adjusting the gain of the amplifier to maintain the output power below a pre-set level. The present invention features the act of comparing the output power level to a maximum power threshold. In response to the comparison, the gain of the amplifier is reduced if the output power level is greater than the maximum power threshold, and maintained if it is determined that the gain is at its maximum permissible setting when the output power is below the maximum power threshold. The present invention also features increasing the gain if the output power level is below the lowest threshold.

After determining whether or not a signal gain change will be accomplished, the present invention features the act of evaluating the reduced, increased, or maintained gain pattern against a pre-defined pattern associated with oscillation. The correlation counter is reset if one or more iterations of the acts of reducing, increasing, and maintaining gain generates a pattern that does not correspond to the pre-defined pattern, and the correlation counter is incremented if one or more iterations of the acts of reducing, increasing, and maintaining gain generate a pattern that correspond to the pre-defined pattern, thus indicating oscillation. Matching to in inexact pattern (e.g., 90% correlation over a specified interval) could also be used to detect oscillation. The maximum gain is reduced and the correlation counter is reset if a correlation threshold is reached.

The present invention also features a method for detecting and controlling oscillation caused by inadequate isolation between antennas used with a bi-directional amplifier. Specifically, the present invention features the acts of measuring the output power of the amplifier; and based on the measurement, controlling the gain of the amplifier. The gain is correlated with a predetermined pattern indicative of oscillation in an amplifier; and the gain of the amplifier is changed accordingly to control oscillation.

BRIEF DESCRIPTION OF THE DRAWINGS

These, and other features and advantages of the present invention will be better understood by reading the following detailed description, taken together with the drawings wherein.

DESCRIPTION OF THE INVENTION

The present invention features a method for detecting and controlling oscillation caused by inadequate isolation between antennas used with a bi-directional amplifier. The method features an Automatic Gain Control (AGC) function for distinguishing between a strong signal caused by oscillation and a strong signal that appears in a passband of the amplifier. The enhanced Automatic Gain Control (AGC) function or feature may be incorporated into various designs. Although the present invention will be described in terms of a software algorithm, this is not a limitation of the present invention as it can also be accomplished in hardware, firmware or combinations of two or more of hardware, software and firmware.

The method features the acts of controlling the amplifier's gain (digital or analog attenuation) and accurately measuring output power of the amplifier. The act of controlling the amplifier's gain may be performed by a variable gain amplifier.

The present invention features a method for differentiating between a very strong signal, which will cause the gain of the amplifier to be reduced to maintain linear operation of the amplifier, and oscillation of the amplifier. This function takes advantage of a key characteristic of oscillation: its amplitude is highly nonlinear with respect to the gain of the amplifier.

Figure 1:
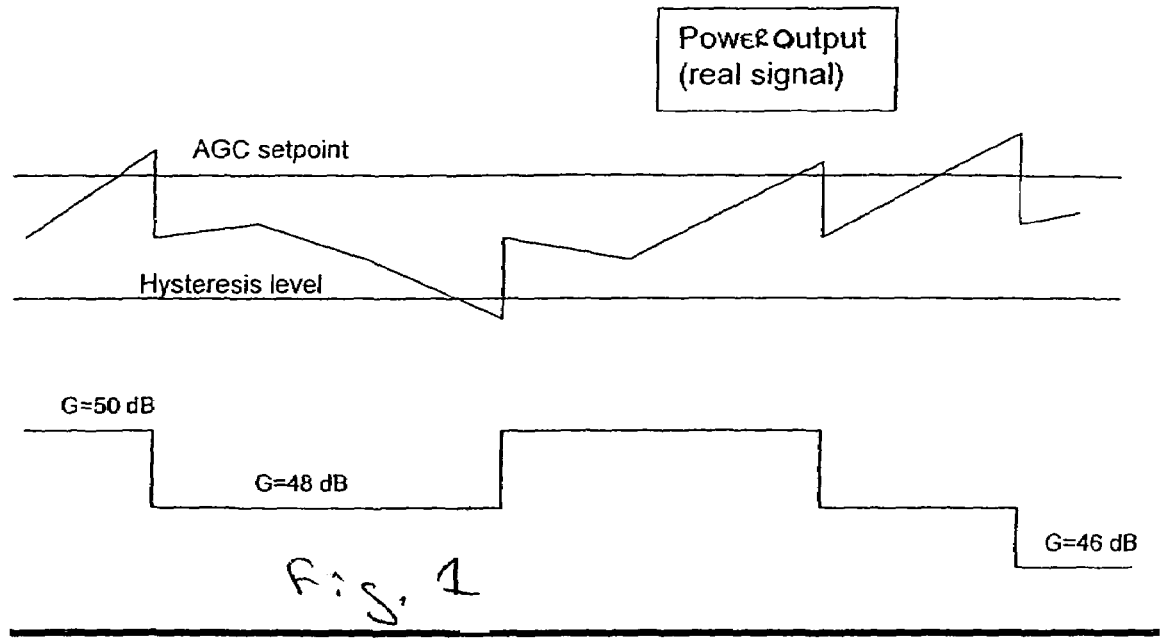
FIG. 1 is a diagram illustrating the result of the Hysteresis level of the correlation process and resultant output signal in accordance with the present invention.

Implementation of an AGC circuit using digital attenuators or variable gain amplifiers requires some degree of Hysteresis to prevent gain "hunting" if the output signal level is near the "set point" of the AGC (i.e., the maximum permitted output level). For example, in the preferred embodiment, an attenuation step size is 2 dB, FIG. 1. In alternative embodiments, the attenuation steps may be 1 dB or ½ dB. In the preferred embodiment, the AGC decreases the gain by 2 dB if the output level is above the AGC set point. The output level at which the gain is increased by 2 dB is called the Hysteresis level and must be carefully chosen. A typical level is 3 dB below the AGC set point. For example, if the AGC set point is +20 dBm, the Hysteresis level is approximately +17 dBm. That is, when gain has been reduced by the AGC and the output level falls below +17 dBm, the gain is increased by one step (e.g., 2 dB). In the case of a real input signal, this will result in a 2 dB increase in output level, which is still below the AGC set point.

Figure 2:
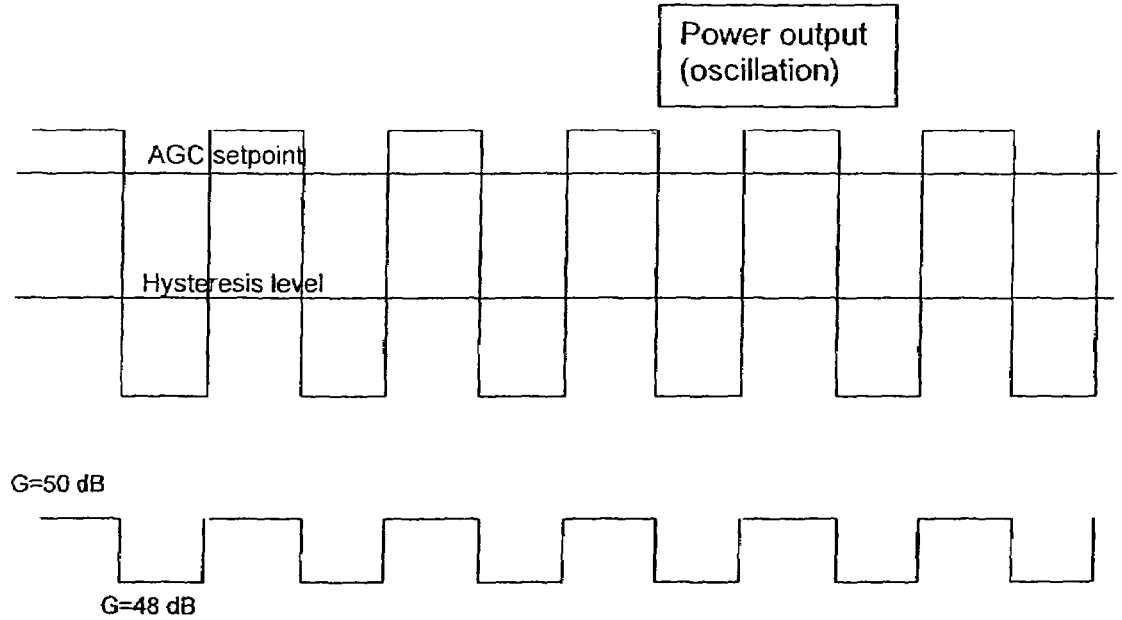
FIG. 2 is a diagram illustrating power output in the case of oscillation.

If a signal is caused by oscillation, the output level will change by significantly more than 2 dB when the gain or attenuation is changed by that amount. The result is that in the case of oscillation, the gain "hunting" process described above will occur. A point will be reached at which the amplifier output power level is above the AGC set point at one gain level, and below the Hysteresis level when the gain has been reduced by one step (e.g., 2 dB), FIG. 2. The result is that the AGC will alternately decrease and increase the gain of the amplifier.

In wireless systems, there is a great degree of randomness in the sum of all signals present in the amplifier's passband, causing random increases and decreases of the amplifier's gain. The present invention features the acts of applying a correlation process as described below and evaluating the response of the AGC to the amplifier output signals. If the signal is caused by oscillation, the gain will alternately be decreased and increased. This activity is tracked or patterned over some number of AGC cycles and if no deviation from this alternating pattern is seen, the amplifier is considered to be oscillating. In the preferred embodiment, the activity is tracked for sixteen of the AGC cycles.

The correlation process is performed by tracking a specified number of alternating AGC gain increase/decrease cycles. If in any AGC cycle, the gain is not changed, or is changed in the same direction as in the previous cycle, the correlator is reset and the process begins again. The length of the correlator is set to minimize false detection due to random signal inputs, while maintaining acceptable sensitivity to oscillation.

Oscillation may take place in either the uplink or the downlink of a bi-directional amplifier, or both. Thus, the correlation process is continuously and separately performed in both directions.

When oscillation is detected in either direction, the gain in both directions is reduced by an amount (e.g., 4 dB) below the level at which the oscillation output drops below the Hysteresis level. This is sufficient to stop oscillation, while maintaining usable gain. The amount by which the gain is reduced will vary, based on factors such as the available gain of the amplifier. The gain is reduced in both directions to maintain balance between the uplink and downlink in the communications system, and may not be appropriate in all cases.

The pattern may be different than alternating up/down in some cases. For example, in the case of a fast attack/slow decay pattern, the pattern may be: down, up, up, up, down, up, up, up, down, etc. Such patterns can also be monitored and acted upon. An inexact match (e.g., 90% correlation over a specified interval) could also be used to identify oscillation.

Figure 3:
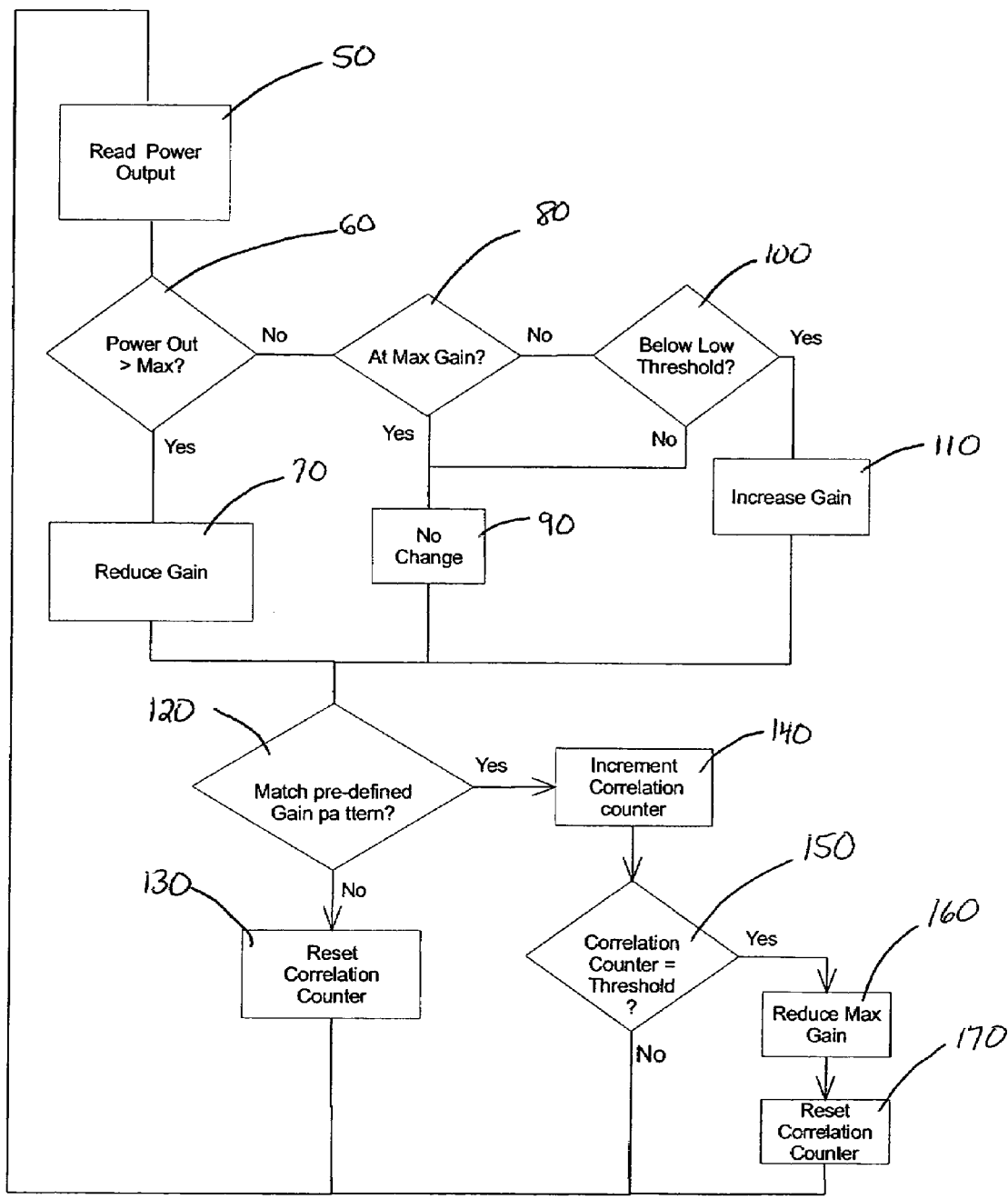
FIG. 3 is a flow chart of a method for determining if a signal in the amplifier is oscillation or a signal in a passband of the amplifier according to one aspect of the present invention.

FIG. 3 illustrates the method of distinguishing between a strong signal caused by oscillation and a strong signal that actually appears in a passband of the amplifier Automatic Gain Control process according to one aspect of the present invention. The method includes the act of monitoring the output power and adjusting the gain of the amplifier to maintain the output power below a pre-set level. The output power level is read, act 50, from a power detector and compared, act 60, with the maximum power threshold. If the power is greater than the maximum power level threshold, the gain of the amplifier is reduced, act 70.

If the output power is below the maximum power threshold, a determination of whether the gain setting is at its maximum permissible setting, act 80 is made. If the gain setting is at its maximum permissible setting, no change is made, act 90. If the gain setting is not at its maximum permissible setting, the output power level is compared with a lower threshold, act 100. If the output power level is below the low power threshold, the gain is increased, act 110.

The action taken (e.g., reducing gain, increasing gain, or no change) is evaluated against the pre-defined pattern 120 associated with oscillation. If the action taken does not correspond to the predefined oscillation pattern, the correlation counter is reset, act 130, and the process begins again from the beginning. If the action taken corresponds to the next action in the pre-defined gain pattern, the correlation counter is incremented, act 140. If the correlation counter threshold is reached after incrementing the correlation counter, act 150, the maximum permissible gain setting is reduced, act 160, and the correlation counter is reset, act 170. A typical value of the correlation counter threshold is 16; however, this value could vary widely depending on the attack time and false activation rate desired. By reducing the maximum permissible gain setting and resetting the correlation counter, it maintains the gain of the amplifier below the level needed to sustain oscillation.

The present invention is not intended to be limited to a system or method which must satisfy one or more of any stated or implied object or feature of the invention and is not limited to the preferred, exemplary, or primary embodiment(s) described herein. Modifications and substitutions by one ordinary skilled in the art are considered to be within the scope of the present invention, which is not to be limited except by the following claims.

What is claimed is:

1. A method for controlling an adjustable gain in an amplifier having an output power level and an adjustable gain, the method comprising the acts of:
   a) obtaining a present output power level from the amplifier (50);
   b) responsive to said act of obtaining the present output power level, comparing the present output power level to a maximum power level threshold (60);
   c) responsive to said act of comparing the obtained present output power level to said maximum power level threshold, reducing the gain of the amplifier if the present output power level is greater than the maximum power level threshold (70);
   d) responsive to said act of comparing the obtained present output power level to said maximum power level threshold determining that said present output power level is less than the maximum power level threshold, determining if the gain of the amplifier is at its maximum permissible setting (80);
   e) responsive to act (d) determining that the gain of the amplifier is at its maximum permissible setting, maintaining the amplifier gain unchanged (90);
   f) responsive to act (d) determining that the gain of the amplifier is less than its maximum permissible setting, determining if said amplifier output power level is below a low power threshold (100);
   g) responsive to act (f) determining that the output power of the amplifier is below a low power threshold, increasing the amplifier gain by a predetermined amount (110);
   h) responsive to act (f) determining that the output power of the amplifier is above a low power threshold, maintaining the amplifier gain unchanged (90);
   i) responsive to said acts of reducing, increasing, and maintaining the gain, evaluating one or more acts of reducing, increasing or maintaining amplifier gain against a pre-defined amplifier gain adjustment act pattern associated with amplifier oscillation (120);
   j) responsive to said act of evaluating, resetting a correlation counter if the evaluated one or more acts of reducing, increasing, and maintaining amplifier gain do not correspond to the pre-defined pattern (130);
   k) responsive to said act of evaluating, incrementing a correlation counter if the evaluated one or more acts of reducing, increasing, and maintaining amplifier gain correspond to the pre-defined pattern (140);
   l) responsive to said act of incrementing the correlation counter, determining if said correlation counter is equal to a maximum correlation counter value (150); and
   m) responsive to said act of determining if said correlation counter is equal to a correlation counter threshold, reducing the amplifier gain by a predetermined amount (160) and resetting the correlation counter (170).

2. A computer executable program carrying out the method of claim 1.

3. A machine readable computer program carrying out the method of claim 1.

4. The method of claim 1 wherein said pre-defined pattern is symmetric.

5. The method of claim 1 wherein said pre-defined pattern is asymmetric.

6. New A method for controlling oscillation caused by inadequate isolation between antennas used with a bi-directional amplifier, the method comprising the acts of:
   a) obtaining a present output power level from the amplifier (50);
   b) responsive to said act of obtaining the present output power level, comparing the present output power level to a maximum power level threshold (60);
   c) responsive to said act of comparing the obtained present output power level to said maximum power level threshold, reducing the gain of the amplifier if the present output power level is greater than the maximum power level threshold (70);
   d) responsive to said act of comparing the obtained present output power level to said maximum power level threshold determining that said present output power level is less than the maximum power level threshold, determining if the gain of the amplifier is at its maximum permissible setting (80);

e) responsive to act (d) determining that the gain of the amplifier is at its maximum permissible setting, maintaining the amplifier gain unchanged (90);

f) responsive to act (d) determining that the gain of the amplifier is less than its maximum permissible setting; determining if said amplifier output power level is below a low power threshold (100);

g) responsive to act (f) determining that the output power of the amplifier is below a low power threshold, increasing the amplifier gain by a predetermined amount (110);

h) responsive to act (f) determining that the output power of the amplifier is above a low power threshold, maintaining the amplifier gain unchanged (90);

i) responsive to said acts of reducing, increasing, and maintaining the gain, evaluating one or more acts of reducing, increasing or maintaining amplifier gain against a pre-defined amplifier gain adjustment act pattern associated with amplifier oscillation over multiple automatic gain control cycles (120);

j) responsive to said act of evaluating, resetting a correlation counter if the evaluated one or more acts of reducing, increasing, and maintaining amplifier gain do not correspond to the pre-defined pattern (130);

k) responsive to said act of evaluating, incrementing a correlation counter if the evaluated one or more acts of reducing, increasing, and maintaining amplifier gain correspond to the pre-defined pattern (140);

l) responsive to said act of incrementing the correlation counter, determining if said correlation counter is equal to a maximum correlation counter value (150); and m) responsive to said act of determining if said correlation counter is equal to a correlation counter threshold, reducing the amplifier gain by a predetermined amount (160) and resetting the correlation counter (170).

\* \* \* \* \*